United States Patent
Kim et al.

(10) Patent No.: US 8,536,554 B2
(45) Date of Patent: Sep. 17, 2013

(54) THREE-TERMINAL METAL-INSULATOR TRANSITION SWITCH, SWITCHING SYSTEM INCLUDING THE SAME, AND METHOD OF CONTROLLING METAL-INSULATOR TRANSITION OF THE SAME

(75) Inventors: Hyun-Tak Kim, Daejeon (KR); Yong-Wook Lee, Daejeon (KR); Bong-Jun Kim, Daejeon (KR); Sung-Youl Choi, Ulsan (KR); Sun-Jin Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 929 days.

(21) Appl. No.: 12/599,248

(22) PCT Filed: May 7, 2008

(86) PCT No.: PCT/IB2008/002441
§ 371 (c)(1),
(2), (4) Date: Nov. 6, 2009

(87) PCT Pub. No.: WO2009/027826
PCT Pub. Date: Mar. 5, 2009

(65) Prior Publication Data
US 2010/0301300 A1    Dec. 2, 2010

(51) Int. Cl.
*H01L 21/02*    (2006.01)
(52) U.S. Cl.
USPC .......................................................... 257/2
(58) Field of Classification Search
USPC .................................................. 257/2, 200
See application file for complete search history.

(56) References Cited

U.S. PATENT DOCUMENTS

| 5,898,554 A | 4/1999 | Schnetzka et al. |
| 6,333,543 B1 | 12/2001 | Schrott et al. |

(Continued)

FOREIGN PATENT DOCUMENTS

| JP | 01-165186 A | 6/1989 |
| JP | 2008-533736 A | 8/2008 |

(Continued)

OTHER PUBLICATIONS

Kim Bong-Jun et al., "Temperature dependence of the first-order metal-insulator transition in $VO_2$ and programmable critical temperature sensor", Applied Physics Letters, AIP, American Institute of Physics, Melville, NY, vol. 90, No. 2, Jan. 12, 2007, pp. 23515-023515. Referred in the Intl. Search Report.

(Continued)

*Primary Examiner* — Nathan Ha
(74) *Attorney, Agent, or Firm* — Rabin & Berdo, P.C.

(57) ABSTRACT

Provided are a 3-terminal MIT switch which can easily control a discontinuous MIT jump and does not need a conventional gate insulating layer, a switching system including the 3-terminal MIT switch, and a method of controlling an MIT of the 3-terminal MIT switch. The 3-terminal MIT switch includes a 2-terminal MIT device, which generates discontinuous MIT in a transition voltage, an inlet electrode and an outlet electrode, which are respectively connected to each terminal of the 2-terminal MIT device, and a control electrode, which is connected to the inlet electrode and includes an external terminal separated from an external terminal of the inlet electrode, wherein an MIT of the 2-terminal MIT device is controlled according to a voltage or a current applied to the control electrode. The switching system includes the 3-terminal MIT switch, a voltage source connected to the inlet electrode, and a control source connected to the control electrode.

23 Claims, 9 Drawing Sheets

(56) References Cited

U.S. PATENT DOCUMENTS

| | | | |
|---|---|---|---|
| 6,365,913 | B1 | 4/2002 | Misewich et al. |
| 6,943,455 | B1* | 9/2005 | Maxwell .................... 257/784 |
| 7,782,637 | B2* | 8/2010 | Selgi et al. .................. 363/49 |
| 2003/0178615 | A1* | 9/2003 | Sato ................................ 257/9 |
| 2005/0236691 | A1 | 10/2005 | Shimada |
| 2006/0244510 | A1* | 11/2006 | Choi et al. .................... 327/525 |
| 2007/0176667 | A1* | 8/2007 | Heurtier et al. .............. 327/333 |
| 2007/0252182 | A1* | 11/2007 | Beck ............................. 257/292 |
| 2008/0088993 | A1* | 4/2008 | Entringer et al. ............ 361/56 |
| 2008/0128619 | A1* | 6/2008 | Yoshida et al. .............. 250/338.1 |
| 2008/0157897 | A1* | 7/2008 | Tilmans et al. ............... 333/105 |

FOREIGN PATENT DOCUMENTS

| | | | |
|---|---|---|---|
| KR | 20040099797 A | 12/2004 | |
| WO | WO-2006-098560 A1 | 9/2006 | |
| WO | WO-2008-054055 A1 | 5/2008 | |

OTHER PUBLICATIONS

Chae et al., "Abrupt metal-insulator transition observed in $VO_2$ thin films induced by a switching voltage pulse", Physica B: Condensed Matter, Amsterdam, NL, vol. 369, No. 1-4, Dec. 1, 2005, pp. 76-80. Referred in the Intl. Search Report.

G Stefanovich et al., "Electrical switching and Mott transition in $VO_2$", Journal of Physics: Condensed Matter, Institute of Physics Publishing, Bristol, GB, vol. 12, No. 41, Oct. 16, 2000, pp. 8837-8845. Referred in the Intl. Search Report.

\* cited by examiner

THREE-TERMINAL METAL-INSULATOR TRANSITION SWITCH, SWITCHING SYSTEM INCLUDING THE SAME, AND METHOD OF CONTROLLING METAL-INSULATOR TRANSITION OF THE SAME

CROSS-REFERENCE TO RELATED PATENT APPLICATION

This application claims the benefit of Korean Patent Application Nos. 10-2007-0043893, filed on May 7, 2007, 10-2007-0073102, filed on Jul. 20, 2007, and 10-2007-0101626, filed on Oct. 9, 2007 in the Korean Intellectual Property Office, the disclosures of which are incorporated herein in their entireties by reference.

BACKGROUND OF THE INVENTION

1. Field of the Invention

The present invention relates to a metal-insulator transition (MIT) device, and more particularly, to a 3-terminal switch including an MIT device, and a switching system including the 3-terminal switch.

2. Description of the Related Art

A conventional semiconductor transistor, which is also referred to as a 3-terminal electronic device, includes a first electrode, a second electrode, and a third electrode as a gate electrode. Such a gate electrode is separated from the first electrode and the second electrode by a gate insulator. In the conventional semiconductor transistor, when a voltage is applied to the gate electrode, a charge is induced. Then a current flows as the induced charge flows according to an electric potential difference between the first electrode and the second electrode. In other words, the conventional semiconductor transistor performs a current on-off operation according to a voltage applied to the gate electrode.

A Mott-Hubbard metal-insulator transition (MIT) transistor (also known as a Mott transistor) that operates according to a continuous MIT without a jump, and a transistor that operates according to a discontinuous MIT with a jump have a structure wherein a third electrode is separated from a first electrode and a second electrode, like a semiconductor transistor.

Since it is not easy to produce a gate insulation layer having excellent insulation property for such transistors, it is difficult to control an on-off operation of the transistors. Specifically, in the transistor including a discontinuous MIT, it is required to develop a structure for easily controlling an MIT jump.

SUMMARY OF THE INVENTION

The present invention provides a 3-terminal metal-insulator transition (MIT) switch, which does not need a conventional gate insulation layer and can easily control a discontinuous MIT jump, a switching system which includes the 3-terminal MIT switch, and a method of controlling MIT of the 3-terminal MIT switch, in a 3-terminal switch including an MIT device that has a discontinuous MIT characteristic.

According to an aspect of the present invention, there is provided a 3-terminal metal-insulator transition (MIT) switch, including: a 2-terminal MIT device, which generates a discontinuous MIT in a transition voltage; an inlet electrode and an outlet electrode, which are respectively connected to each terminal of the 2-terminal MIT device; and a control electrode, which is connected to the inlet electrode and includes an external terminal separated from an external terminal of the inlet electrode, wherein an MIT of the 2-terminal MIT device is controlled according to a voltage or a current applied to the control electrode.

The 3-terminal MIT switch may be formed into a package, wherein the control electrode is connected to the inlet electrode inside the package, and the external terminal of the inlet electrode and the external terminal of the control electrode are separately exposed to the outside of the package. The 3-terminal MIT switch may be formed into a package, wherein the control electrode is connected to the inlet electrode outside the package, and the external terminal of the inlet electrode and the external terminal of the control electrode are separated from each other.

The inlet electrode may be connected to a first terminal of the 2-terminal MIT device through a first thin film resistor and the control electrode is connected to the first terminal of the 2-terminal MIT device through a second thin film resistor. The inlet electrode may be directly connected to the first terminal of the 2-terminal MIT device, and the control electrode is connected to the 2-terminal MIT device by being connected to the inlet electrode through the second thin film resistor.

An MIT of the 2-terminal MIT device may be controlled by applying a uniform voltage to the external terminal of the inlet electrode and applying a transition voltage or current to the external terminal of the control electrode. An MIT in a predetermined period may be generated in the 2-terminal MIT device by applying a continuous wave voltage in a predetermined frequency to the control electrode. A voltage applied to the inlet electrode may be lower than the transition voltage, and when a sum of a voltage applied to the control electrode and the voltage applied to the inlet electrode may be higher than the transition voltage, the 3-terminal MIT switch may be turned on as an MIT occurs in the 2-terminal MIT device, and when the sum is lower than the transition voltage, the 3-terminal MIT switch may be turned off as the MIT is removed in the 2-terminal MIT device. The 3-terminal MIT switch can be controlled by adjusting the voltage applied to the control electrode.

Meanwhile, a resistance device, having a predetermined resistance value, may be connected to each external terminal of the inlet electrode and the control electrode in order to protect the 3-termianl MIT switch. The 3-terminal MIT switch may be used in at least one switching device from among a low voltage switching device, a high voltage switching device, a low current switching device, a high current switching device, a low power switching device, and a high power switching device. The 3-terminal MIT switch may be used in a sensor, which detects physical or chemical factors including a voltage or an electric field, temperature, pressure, and light that can control concentration of the 2-terminal MIT device.

According to another aspect of the present invention, there is provided a switching system including: a 3-terminal MIT switch, a voltage source connected to an inlet electrode, and a control source connected to a control electrode.

In the switching system, a plurality of 3-terminal MIT switches may be collectively disposed in an array or a matrix structure. Switching of various currents or voltages can be simultaneously controlled by differently setting the transition voltages of the 2-terminal MIT devices of each of the 3-terminal MIT switches. Also, as the 3-terminal switches are arranged in an array or matrix structure, the switching system can be used as an image sensor.

According to another aspect of the present invention, there is provided a method of controlling an MIT of a 3-terminal MIT switch, which includes an MIT device that generates an MIT in a transition voltage, an inlet and outlet electrodes connected to each terminal of the MIT device, and a control electrode that is connected to the inlet electrode and includes an external terminal separated from an external terminal of the inlet electrode, wherein the MIT of the MIT device is controlled by varying a voltage applied to the control electrode.

The method can generate MIT of a predetermined period in the MIT device by applying a uniform voltage to the external terminal of the inlet electrode and applying a continuous wave voltage of a predetermined frequency to the control electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
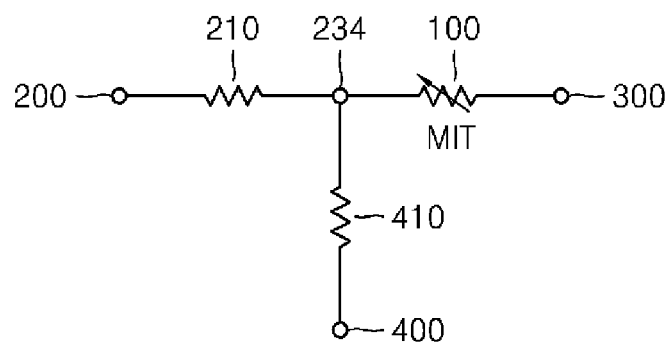
FIG. 1A is an equivalent circuit diagram illustrating a 3-termianl metal-insulator transition (MIT) switch according to an embodiment of the present invention.

Hereinafter, the present invention will be described more fully with reference to the accompanying drawings, in which exemplary embodiments of the invention are shown. It will be understood that when a component is referred to as being "on" another component, it can be directly on the other component, or an intervening component may also be present. The sizes and thicknesses of components are exaggerated for clarity, and parts unrelated to the description are omitted herein. In the drawings, like reference numerals denote like elements. Meanwhile, terms used to describe the present invention are for descriptive purposes only and are not intended to limit the scope of the invention.

FIG. 1A is an equivalent circuit diagram illustrating a 3-terminal metal-insulator transition (MIT) switch according to an embodiment of the present invention. Here, a variable resistor is an MIT device.

Referring to FIG. 1A, the 3-terminal MIT switch includes an MIT device 100, a triple contact point 234 and an outlet electrode 300 connected to the MIT device 100, and an inlet electrode 200 and a control electrode 400 connected to the triple contact point 234. The inlet electrode 200 and the control electrode 400 are connected to the triple contact point 234 respectively through a first thin film resistor 210 and a second thin film resistor 410. The structure and operations of the 3-terminal MIT switch will be described later with reference to FIGS. 1B through 1G.

A 2-terminal MIT device can be generally manufactured as a vertical type or a horizontal type, and the two terminals of the 2-terminal MIT device respectively correspond to the inlet electrode 200 and the outlet electrode 300 of the 3-terminal MIT switch.

The 2-terminal MIT device will now be described briefly. The vertical 2-terminal MIT device includes a substrate, a buffer layer formed on the substrate, and a first electrode thin film, an MIT thin film, and a second electrode thin film formed on the top of the buffer layer. The first electrode thin film and the second electrode thin film respectively correspond to the inlet electrode 200 and the output electrode 300, and the MIT thin film corresponds to the MIT device 100.

The MIT thin film, i.e., the MIT device 100, may include at least one of a p-type inorganic semiconductor, a p-type inorganic insulator, a p-type organic semiconductor, and a p-type organic insulator, in which low concentration holes are added. In this case, the concentration of the added holes is approximately $3 \times 10^{16}$ cm$^{-3}$. Also, the 2-termianl MIT device 100 may include at least one of oxygen, carbon, Si, Ge, semiconductor compounds (III-V group and II-IV group), metal transition elements, rare earth elements, and lanthan elements. For example, the MIT device 100 may be formed of a compound of GaAS, GaSb, InP, InAs, and GST (GeSbTe), or a semiconductor material, such as Si and Ge. Meanwhile, the MIT device 100 may be formed as an n-type that includes a semiconductor or an insulator having very large resistance.

In detail, the MIT device 100 may include at least one material from among an oxide film material containing at least one of $Al_2O_3$, $VO_2$, $V_2O_3$, $ZrO_2$, ZnO, $HfO_2$, CuO, $Ta_2O_5$, $La_2O_3$, $Fe_2O_3$, NiO, and MgO, and an oxide film material containing at least one of $Al_xTi_yO$, $Zn_xTi_yO$, $Zr_xTi_yO$, $Ta_xTi_yO$, $V_xTi_yO$, $La_xTi_yO$, $Ba_xTi_yO$, and $Sr_xTi_yO$, and a semiconductor material containing at least one of GaAS, GaSb, InP, InAs, GST (GeSbTe), Si, and Ge.

The MIT device 100 can be manufactured by using at least one method from among a sputtering method, a molecular beam epitaxy (MBE), an e-beam evaporation, a thermal evaporation, an atomic layer epitaxy (ALE), a pulsed laser deposition (PLD), a chemical vapor deposition (CVD), a Sol-Gel method, and an atomic layer deposition (ALD).

Meanwhile, the first and second electrode thin films, i.e., the inlet and outlet electrodes 200 and 300, may include at least one of Al, Cu, Ni, W, Mo, Cr, Zn, Mg, Fe, Co, Sn, Pb, Au, Ag, Pt, Ti, Ta, TaN, TaW, WN, TiN, TiW, poly-Si, and an oxide electrode. Examples of the oxide electrode include IrO, RuO, InSnO (InO:Sn) and ZnO.

The substrate may be formed of at least one material from among Si, $SiO_2$, GaAs, $Al_2O_3$, plastic, glass, $V_2O_5$, $PrBa_2Cu_3O_7$, $YBa_2Cu_3O_7$, MgO, $SrTiO_3$, Nb doped $SrTiO_3$, and silicon on an insulation thin film (SOI).

An electrical characteristic of the MIT device 100 rapidly changes according to an applied voltage. In other words, the MIT device 100 shows characteristics of an insulator under an MIT generation voltage (hereinafter, referred to as a transition voltage), and shows characteristics of a metallic material at or over the transition voltage since a discontinuous MIT jump occurs. For reference, MIT can occur in the MIT device 100 due to physical or chemical factors including temperature, pressure, and light, which can be used to control a voltage and also hole doping. Accordingly, the MIT device 100 can be used in a sensor that can detect physical or chemical factors.

The 2-termianl MIT device of a horizontal type will now be described. The 2-terminal MIT device of a horizontal type includes a substrate, a buffer layer formed on the substrate, the MIT device 100 formed on a part of the top surface of the buffer layer, and the inlet and output electrodes 200 and 300 facing each other respectively at the side and top of the MIT device 100 on the top of the buffer layer. In other words, the inlet electrode 200 and the outlet electrode 300 are horizontally separated, and the MIT device 100 is interposed between the inlet and output electrodes 200 and 300.

Materials of each element of the 2-terminal MIT device of a horizontal type are the same as the materials of each element of the 2-terminal MIT device of a vertical type described above. The 2-terminal MIT device of a horizontal or vertical type can be miniaturized to a µm unit, and can be manufactured with low costs.

The 3-terminal MIT switch according to the current embodiment may have the vertical type structure or the horizontal type structure of the 2-termianl MIT device, and further includes the control electrode 400 for controlling MIT of the MIT device 100. The control electrode 400 may be formed of the same material as the inlet and outlet electrodes 200 and 300.

Figure 1B:
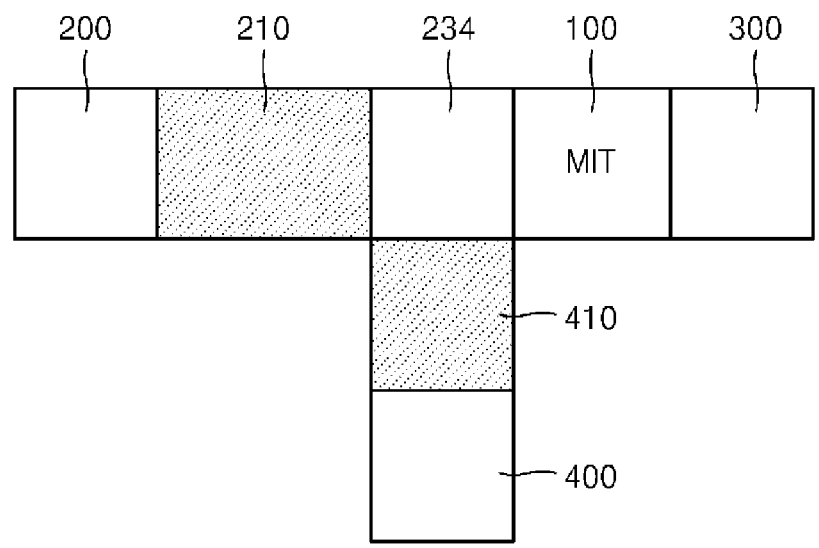
FIG. 1B is a diagram illustrating an internal structure of the 3-terminal MIT switch illustrated in FIG. 1A.

FIG. 1B is a diagram illustrating an internal structure of the 3-terminal MIT switch illustrated in FIG. 1A.

Referring to FIG. 1B, the 3-terminal MIT switch includes the MIT device 100, which generates a discontinuous MIT at a certain voltage, i.e., the transition voltage, the triple contact point 234 and the outlet electrode 300 formed on each end of the MIT device 100, the first and second thin film resistors 210 and 410 formed on each sides of the triple contact point 234, the inlet electrode 200 connected to the first thin film electrode 210 and the control electrode 400 connected to the second thin film electrode 410.

Such a structure is the most typical structure of the 3-terminal MIT switch of FIG. 1A, and the inlet electrode 200, the outlet electrode 300, and the control electrode 400 form 3 terminals electrically connected to the MIT device 100. The first and second thin film resistors 210 and 410 can be formed on any side of the triple contact point 234 as long as the first and second thin film resistors 210 and 410 are separated from each other.

In detail, the inlet electrode 200 and the control electrode 400 are respectively connected to the triple contact point, which is formed in a first terminal (plus) of the MIT device 100, through the first thin film resistor 210 and the second thin film resistor 410. Also, the outlet electrode 300 is connected to a second terminal (minus) of the MIT device 100. The smaller a resistance value of the first thin film resistor 210, it is the better and in some cases, the resistance value of the first thin film resistor 210 may be 0. The first and second thin film resistors 210 and 410 can be formed by using a thin film for MIT device or by evaporating a resistive material thin film on the triple contact point 234. The triple contact point 234 may be formed of a general conductive material, such as metal.

In the current embodiment, an inlet current ($I_{inlet}$) flows in the inlet electrode 200 as a uniform voltage is applied to an external terminal of the inlet electrode 200, and a control current ($I_{control}$) flows in the control electrode 400 as a transition voltage is applied to an external terminal of the control electrode 400. Accordingly, MIT of the MIT device 100 can be controlled, and an outlet current ($I_{outlet}$) can be calculated by adding $I_{inlet}$ and $I_{control}$. In order to prevent occurrence of a leakage current in the MIT device 100, i.e., to obtain $I_{outlet}=0$, $I_{control}=-I_{inlet}$, leakage current occurring in the MIT device 100 can be controlled through the control current. Generally, $I_{control}$ is a current flowing in a semiconductor, and thus a current density is approximately $10^2$ A/cm$^2$~$10^3$ A/cm$^2$. When MIT occurs, current density of $I_{outlet}$ is approximately $10^5$ A/cm$^2$~$10^6$ A/cm$^2$. Accordingly, an amplification rate is approximately $I_{outlet}/I_{control} \approx 100$~$1000$.

Figure 1C:
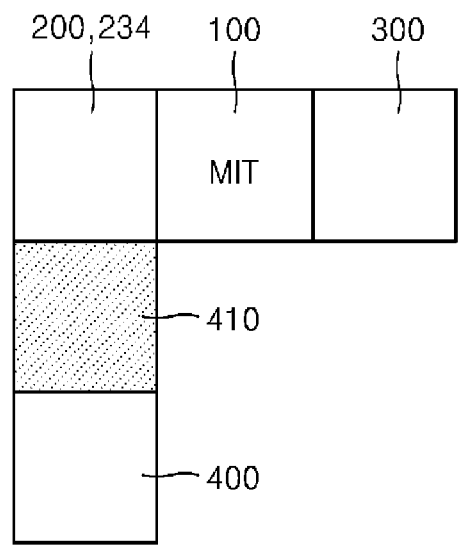
FIG. 1C is a diagram illustrating an internal structure of the 3-terminal MIT switch illustrated in FIG. 1A, when a resistance value of a first thin film resistor is 0, i.e., in the case where no first thin film resistor is formed.

FIG. 1C is a diagram illustrating an internal structure of the 3-terminal MIT switch illustrated in FIG. 1A, when a first thin film resistor is 0, i.e. in the case where the first thin film resistor 210 is not formed.

Referring to FIG. 10, unlike FIG. 1B, the 3-terminal MIT switch does not include the first thin film resistor 210. Also, since the inlet electrode 200 is formed of a conductive material, the triple contract point 234 can be used as an inlet electrode. Accordingly, the 3-termianl MIT switch can be realized in a simpler structure than the 3-terminal MIT switch of FIG. 1B.

Figure 1D:
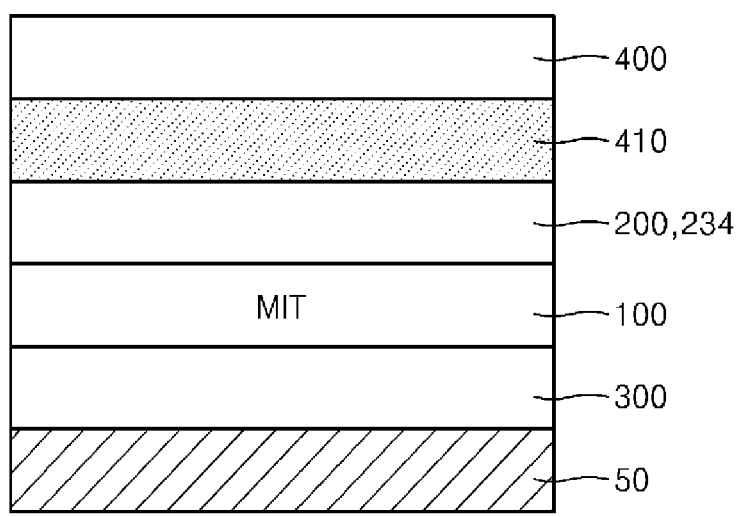
FIG. 1D is a diagram illustrating a multi-layer type 3-terminal MIT switch in the case where a resistance value of a first thin film resistor is 0 in the 3-termianl MIT switch illustrated in FIG. 1A.

FIG. 1D is a diagram illustrating a multi-layer vertical type 3-terminal MIT switch when the first thin film resistor 210 is 0 in the 3-termianl MIT switch illustrated in FIG. 1A.

Referring to FIG. 1D, the multi-layer type 3-terminal MIT switch is formed by sequentially laying the outlet electrode 300, the MIT device 100, the inlet electrode 200, the second thin film resistor 410, and the control electrode 400 on a substrate 50. Functions of the multi-layer type 3-terminal MIT switch are to the same as functions of the horizontal type 3-terminal MIT switch of FIG. 10. Meanwhile, the horizontal type 3-terminal MIT switch of FIG. 1B can also be realized as a multi-layer type by forming the triple contact point 234 on the MIT device 100, respectively forming the first and second thin film resistors 210 and 410 on the triple contact point 234, and then forming the inlet electrode 200 and the outlet electrode 400 on the first and the second thin film resistor 210 and 410. In such a multi-layer type, an insulation layer or the like may be inserted between the inlet electrode 200 and the control electrode 400 so that a separate voltage is applied to the inlet electrode 200 and the control electrode 400.

Figure 1E:
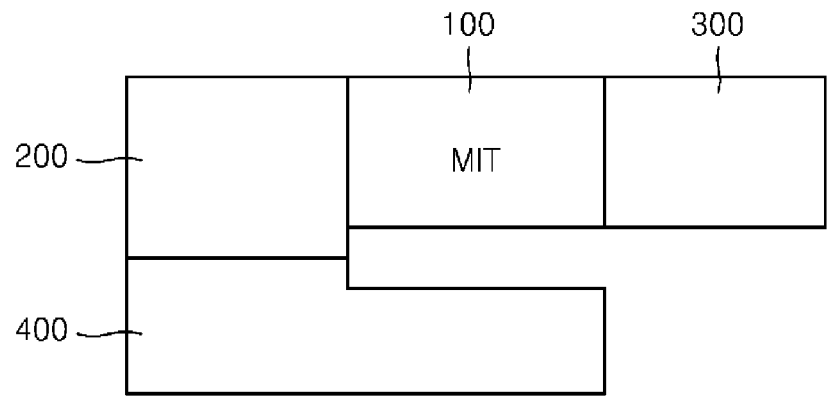
FIG. 1E is a diagram illustrating an internal structure of the 3-terminal MIT switch illustrated in FIG. 1A, when resistance values of first and second thin film resistors are 0, i.e., in the case where no first and second thin film resistors are formed.

FIG. 1E is a diagram illustrating an internal structure of the 3-terminal MIT switch illustrated in FIG. 1A, when resistance values of first and second thin film resistors 210 and 410 are 0, i.e. in the case where the first and second thin film resistors 210 and 410 are not formed.

Referring to FIG. 1E, the 3-terminal MIT switch has a simpler structure than the 3-terminal MIT switch of FIG. 1C by not forming the first thin film resistor 210 and the second thin film resistor 410 as well. In other words, the control electrode 400 is directly connected to the inlet electrode 200 or the triple contact point 234.

However, in the case of the 3-terminal MIT switches of FIGS. 1C through 1E, a voltage or a current applied through the inlet electrode 200 or the control electrode 400 is directly applied to the MIT device 100 without any filtering through a thin film resistor. Accordingly, the voltage or the current should be minutely controlled in order to protect the MIT device 100.

Figure 1F:
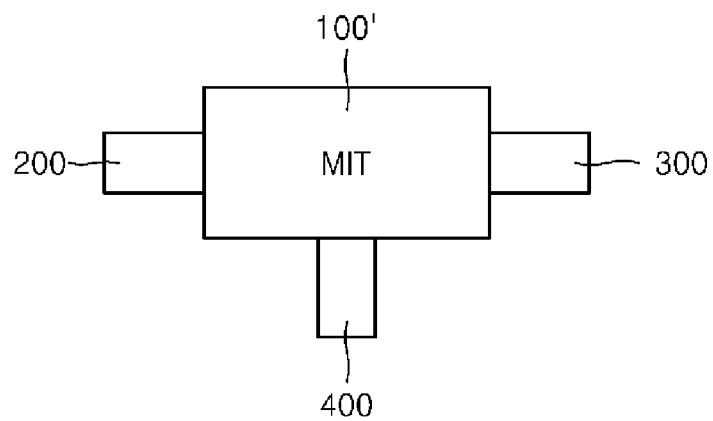
FIG. 1F is a diagram illustrating a packaged structure of the 3-terminal MIT switch illustrated in FIG. 1A according to an embodiment of the present invention.

FIG. 1F is a diagram illustrating a packaged structure of the 3-terminal MIT switch illustrated in FIG. 1A according to an embodiment of the present invention. FIG. 1F shows an external appearance of the packaged 3-termianl MIT switch. The MIT device 100 is packaged inside an MIT device 100'.

Referring to FIG. 1F, the 3-terminal MIT switch is packaged to be used for various applications. As illustrated in FIGS. 1B through 1E, the inlet electrode 200 and the control electrode 400 are internally connected to each other, but after the 3-terminal MIT switch is packaged, the external terminal of the inlet electrode 200 and the external terminal of the control electrode 400 are separated from each other. Accordingly, different voltages are applied to the external terminals of the inlet electrode 200 and the control electrode 400, since different power suppliers are connected to the external terminals of the inlet electrode 200 and the control electrode 400. This will be described in detail later with reference to FIG. 3.

Figure 1G:
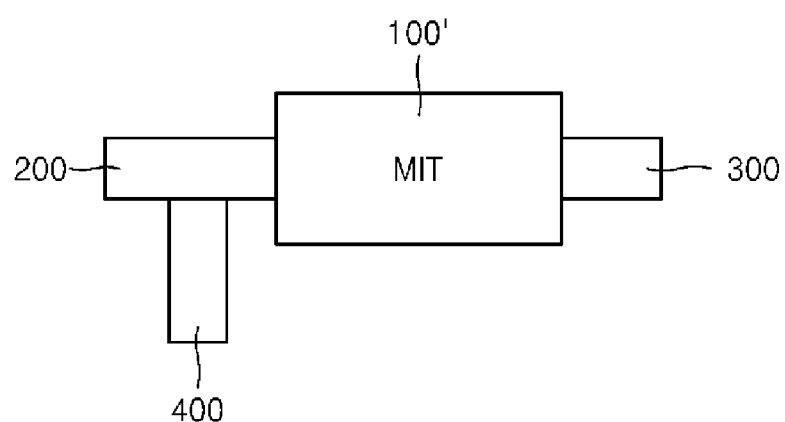
FIG. 1G is a diagram illustrating a packaged structure of the 3-terminal MIT switch illustrated in FIG. 1A according to another embodiment of the present invention.

FIG. 1G is a diagram illustrating a packaged structure of the 3-terminal MIT switch illustrated in FIG. 1A according to another embodiment of the present invention.

In the 3-terminal MIT switch of FIG. 1F, the inlet electrode 200 and the control electrode 400 are internally connected to each other and each external terminal is separated from each other. However, in FIG. 1G, the inlet electrode 200 and the control electrode 400 are connected outside the packaged 3-termianl MIT switch. In other words, the inlet electrode 200 and the control electrode 400 are connected outside the MIT device 100'.

Even when the inlet electrode 200 and the control electrode 400 are externally connected to each other, functions of the 3-termianl MIT switch are the same as the functions of the 3-terminal MIT switch of FIG. 1F. In other words, whether the 3-terminal MIT switch is to be manufactured as described with reference to FIG. 1F or FIG. 1G is optionally determined according to of its application. Generally, the 3-terminal MIT switch may preferably have the structure of FIG. 1F in order to protect a connection part of the inlet electrode 200 and the control electrode 400. Also, even when a thin film resistor is included as illustrated in FIGS. 1A through 1D, a package having an internal connection structure may be used in order to maintain a resistive characteristic of the thin film resistor.

Operations of the 3-termianl MIT switch will now be described in detail through experimental data, etc.

Figure 2:
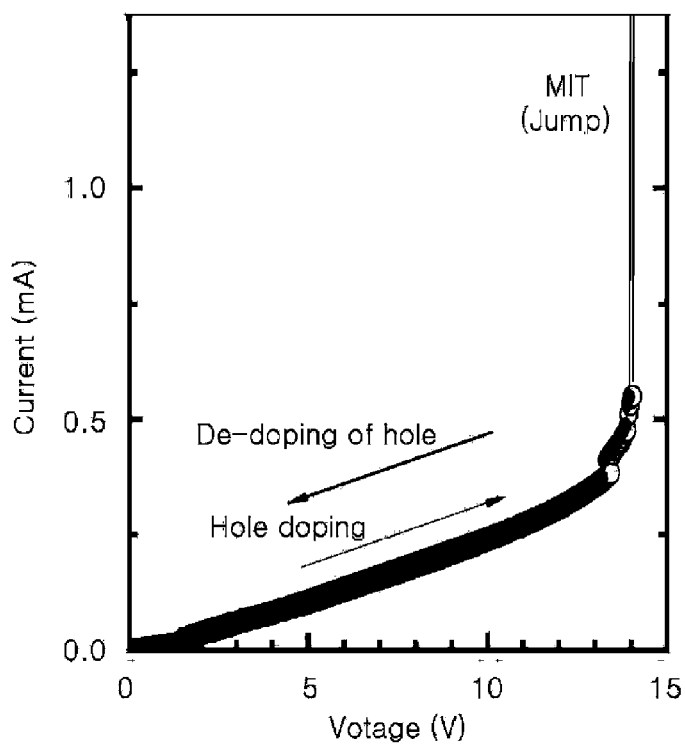
FIG. 2 is a voltage-current curve graph illustrating an MIT jump measured in a 2-terminal MIT device.

FIG. 2 is a voltage-current curve graph illustrating an MIT jump measured in a 2-terminal MIT device.

Referring to FIG. 2, an occurrence of a discontinuous MIT jump is illustrated when a voltage is applied through an inlet electrode and an outlet electrode at each terminal of the 2-terminal MIT device. In FIG. 2, the discontinuous MIT occurs at approximately 14 V, and thus it can be seen that a transition voltage of the 2-terminal MIT device is approximately 14 V.

Accordingly, in the case of the 2-terminal MIT device, the discontinuous MIT jump occurs only by the voltage applied through the inlet electrode, and thus it is difficult to control the discontinuous MIT jump. Also, even when the voltage applied to the inlet electrode is lowered below the transition voltage after the discontinuous MIT jump has occurred, MIT is not promptly removed due to a voltage-current hysteresis loop. Accordingly, it is more difficult to control the discontinuous MIT jump.

Figure 3:
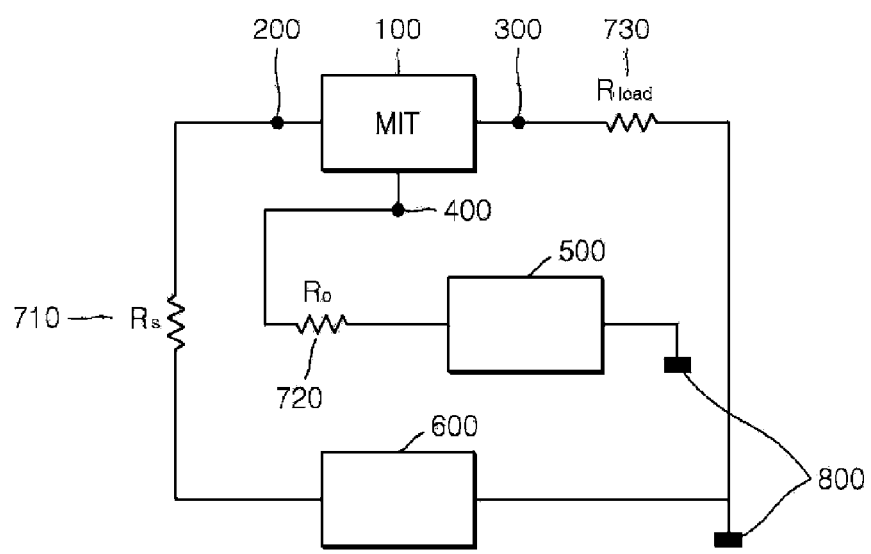
FIG. 3 is a circuit diagram illustrating a switching system using the 3-terminal MIT switch according to an embodiment of the present invention.

FIG. 3 is a circuit diagram illustrating a switching system including the 3-terminal MIT switch of FIG. 1A according to an embodiment of the present invention.

Referring to FIG. 3, the switching system includes the 3-terminal MIT switch of FIG. 1, a voltage source 600 connected to the inlet electrode 200 and a control source 500 connected to the control electrode 400. Each electrode or external terminal of the 3-terminal MIT switch is respectively illustrated as contact points 200, 300, and 400. Meanwhile, the outlet electrode 300 is connected to a ground 800.

In order to protect the MIT device 100, external resistors $R_S$ and $R_O$ 710 and 720 are respectively connected between the inlet electrode 200 and the voltage source 600 and between the control electrode 400 and the control source 500. Also, a load resistor $R_{load}$ 730 is connected between the outlet electrode 300 and the ground 800. The load resistor $R_{load}$ 730 may be omitted according to a voltage measurement location or use of the switching system. The external resistors $R_S$ and $R_O$ 710 and 720 have the same functions as the first and second thin film resistors 210 and 410.

In the switching system according to the current embodiment of the present invention, the voltage source 600 applies a uniform voltage to the MIT device 100 through the inlet electrode 200. The uniform voltage is lower than the transition voltage, and thus a discontinuous MIT jump cannot occur in the MIT device 100. The voltage source 600 may change the applying voltage according to a voltage change of the MIT device 100 after an MIT occurrence in the MIT device 100. In other words, by setting the voltage source 600 as a fixed current source, the voltage can be varied in order to keep constant a current when the current abruptly increases due to the MIT occurrence. The voltage source 600 may be a parameter analyzer.

The control source 500, which applies the voltage to the control electrode 400, is a voltage source that applies a transition voltage or current to the control electrode 400. The discontinuous MIT jump of the MIT device 100 can be thus controlled via the control source 500 by applying the transition voltage. In other words, when the sum of the voltage applied through the control source 500 and the voltage applied through the voltage source 600 is higher than the transition voltage, the discontinuous MIT jump occurs in the MIT device 100, and when the sum of the voltage applied through the control source 500 and the voltage applied through the voltage source 600 is smaller than the transition voltage, the discontinuous MIT jump is removed. Accordingly, the discontinuous MIT jump is controlled.

This operation is based on the Hole-driven MIT theory. In brief, the transition voltage of the MIT device 100 is changed by doping or de-doping holes of the MIT device 100 through the voltage applied to the control electrode 400. That is, the discontinuous MIT jump occurs when the sum of the voltage of the control electrode 400 and the voltage of the inlet electrode 200 is higher than the transition voltage as described above. The voltage applied to the control electrode 400 may be instantaneously applied so that it can be added to the voltage of the inlet electrode 200. The control source 500 may be a function generator, which can apply a periodical pulse wave.

Figure 4:
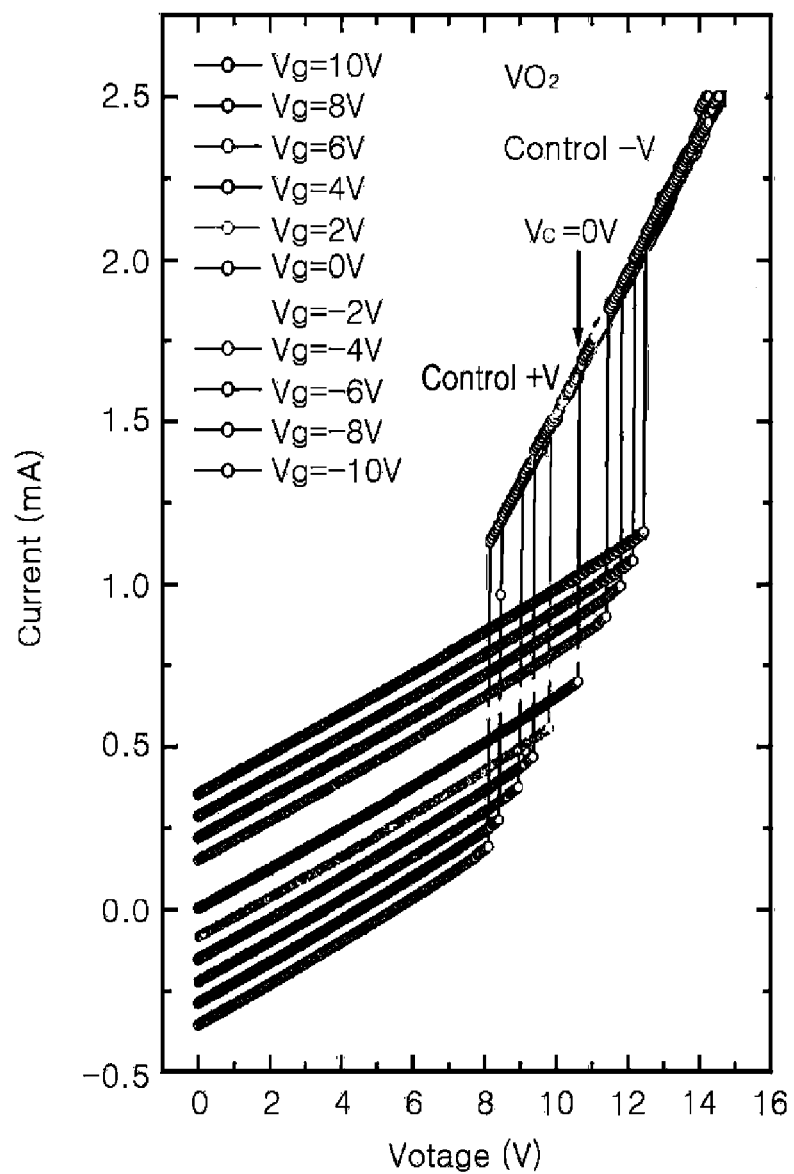
FIG. 4 is a diagram illustrating a voltage-current measured in the switching system of FIG. 3, which includes an MIT device manufactured by using $VO_2$.

FIG. 4 is a diagram illustrating a voltage-current measured in the switching system of FIG. 3, which uses an MIT device manufactured by using $VO_2$. In FIG. 4, a voltage applied to the control electrode 400 is changed from −10 to +10 V without using the load resistor $R_{load}$ 730. The x-axis denotes a voltage applied to the MIT device 100 through voltage source 600.

Referring to FIG. 4, it can be seen that the voltage that generates the discontinuous MIT jump of the MIT device 100, i.e., the transition voltage, changes according to the voltage applied to the control electrode 400. When the voltage applied to the control electrode 400 is high, the transition voltage is low and visa versa. Such a phenomenon occurs by doping or de-doping low concentration holes on the MIT device 100 as the voltage is applied through the control electrode 400 as described above.

Alternatively, when the voltage applied to the voltage source 600 through the inlet electrode 200 is constant, the discontinuous MIT jump is occurred or removed in the MIT device 100 according to the voltage of the control electrode 400. This will be described later with reference to FIG. 6.

As illustrated in FIG. 4, the discontinuous MIT jump of the 3-terminal MIT switch can be controlled through the voltage applied to the control electrode 400. In other words, by regulating the voltage applied to the control electrode 400, MIT can be generated in or removed from the MIT device 100.

Figure 5:
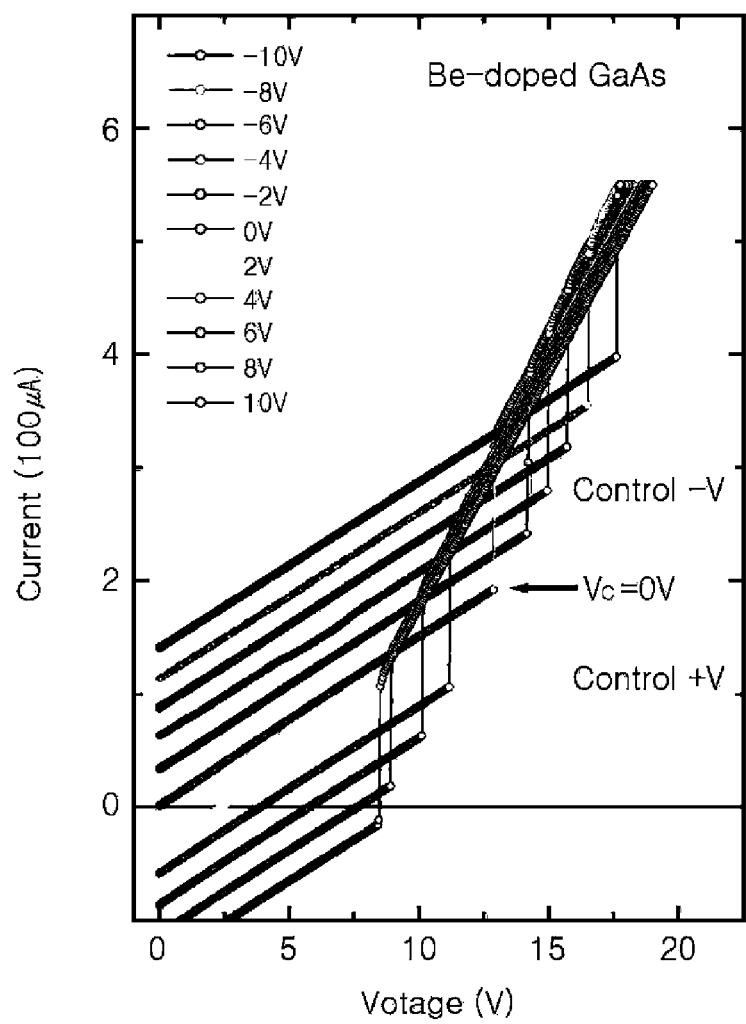
FIG. 5 is a graph illustrating a voltage-current measured in the switching system of FIG. 3, which includes an MIT device manufactured by using Be doped GaAs.

FIG. 5 is a graph illustrating a voltage-current measured in the switching system of FIG. 3, which uses an MIT device manufactured by using Be doped GaAs. Similarly to FIG. 4, a voltage applied to the control electrode 400 is changed from −10 to +10 V without using the load resistor $R_{load}$ 730.

It can be seen that the transition voltage changes according to the voltage applied to the control electrode 400, like FIG. 4. In other words, when the voltage applied to the control electrode 400 is low, the transition voltage is high and visa versa.

Figure 6:
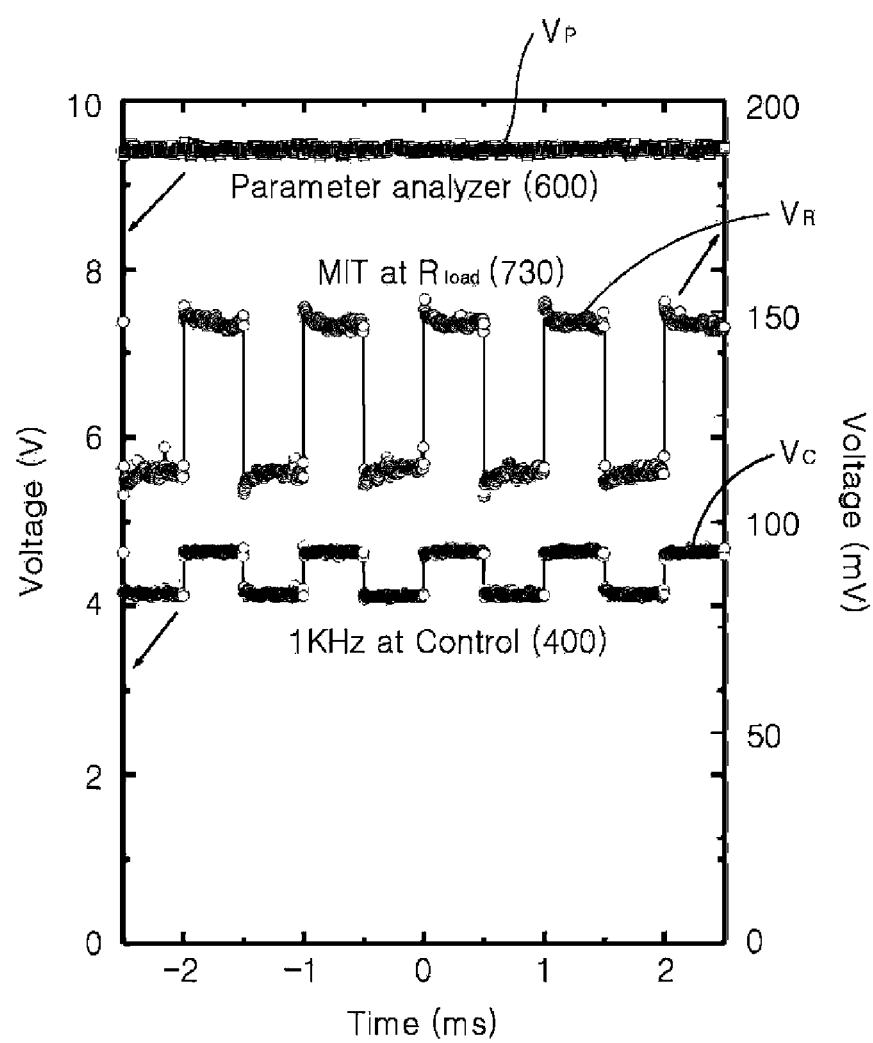
FIG. 6 is a diagram illustrating an MIT change in an MIT device by inputting a modulated wave, which is modulated in a function generator of a control electrode, in the switching system of FIG. 3.

FIG. 6 is a diagram illustrating an MIT change in an MIT device obtained by inputting a modulated wave, which is modulated in a function generator of the control electrode 400, in the switching system of FIG. 3. The top curve denotes the voltage applied to the voltage source 600 and uses a voltage unit on the left, an intermediate curve having a pulse wave form denotes a voltage measured at the front end of the load resistor $R_{load}$ 730 and uses a voltage unit on the right, and a bottom curve having a pulse wave form denotes the voltage applied to the control electrode 400 and uses the voltage unit on the left.

Referring to FIG. 6, a uniform voltage is applied to the voltage source 600, and a pulse wave as a periodical continuous wave form is applied through the control source 500. When a high voltage section is applied to the control electrode 400, a discontinuous MIT jump occurs in the MIT device 100, and thus a low voltage hangs on the MIT device 100. Accordingly, a high voltage hangs on the load resistor $R_{load}$ 730. Alternatively, when a low voltage section is applied, MIT in the MIT device 100 is removed, and thus a high voltage acts on the MIT device 100. Accordingly, a low voltage hangs on the load resistor $R_{load}$ 730.

In other words, since the voltage applied to the voltage source 600 is lower than the transition voltage of the MIT device 100, a discontinuous MIT jump does not occur, but when the sum of the voltage applied to the voltage source and the voltage applied to the control electrode 400 is higher than the transition voltage, the discontinuous MIT jump occurs. Also, when the sum is lower than the transition voltage, the discontinuous MIT jump is removed. Accordingly, it can be seen that the occurrence of the discontinuous MIT jump in the MIT device 100 can be controlled by regulating the voltage applied to the control electrode 400 as described above.

Meanwhile, when the discontinuous MIT jump is generated in the MIT device 100, an oscillation characteristic appears according to a voltage or period of the applied pulse wave. This will now be described in detail.

Figure 7A:
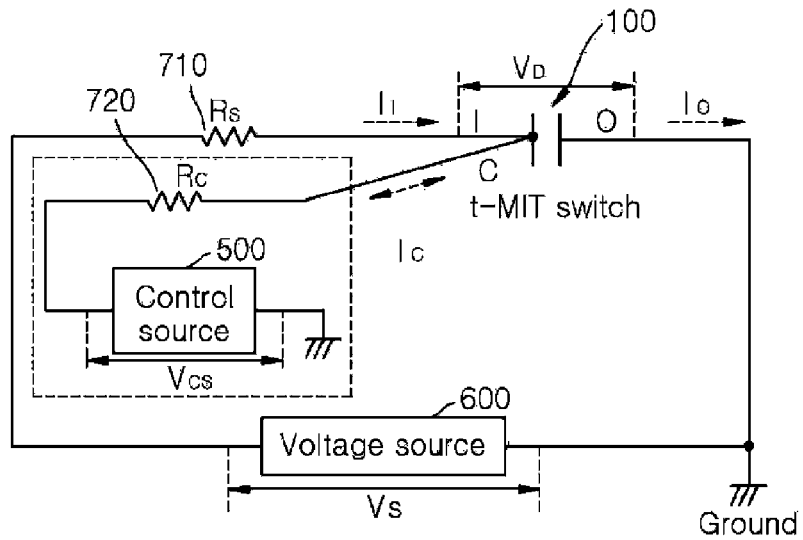
FIG. 7A is a circuit diagram illustrating in detail the switching system of FIG. 3 by indicating voltage and current in each section.

FIG. 7A is a circuit diagram illustrating in detail the switching system of FIG. 3, by indicating the voltage and current in each section.

Referring to FIG. 7A, the switching system of FIG. 7A is identical to the switching system of FIG. 3, and voltages acting on each device and currents flowing through circuits are indicated with reference numerals. $V_S$ denotes the voltage applied to the voltage source 600, $V_{CS}$ denotes the voltage applied to the control source 500, and $V_D$ denotes the voltage that hangs on the MIT device 100. $R_S$ denotes a first external resistor 710 between the voltage source 600 and the MIT device 100, and $R_C$ denotes a second external resistor 720 between the control source 500 and the MIT device 100. Meanwhile, $I_I$ denotes a current inputted through the voltage source 600, $I_C$ denotes a current inputted through the control source 500, and $I_O$ denotes a current outputted through the MIT device 100. In FIG. 7, the load resistor $R_{load}$ 730 is omitted.

Figure 7B:
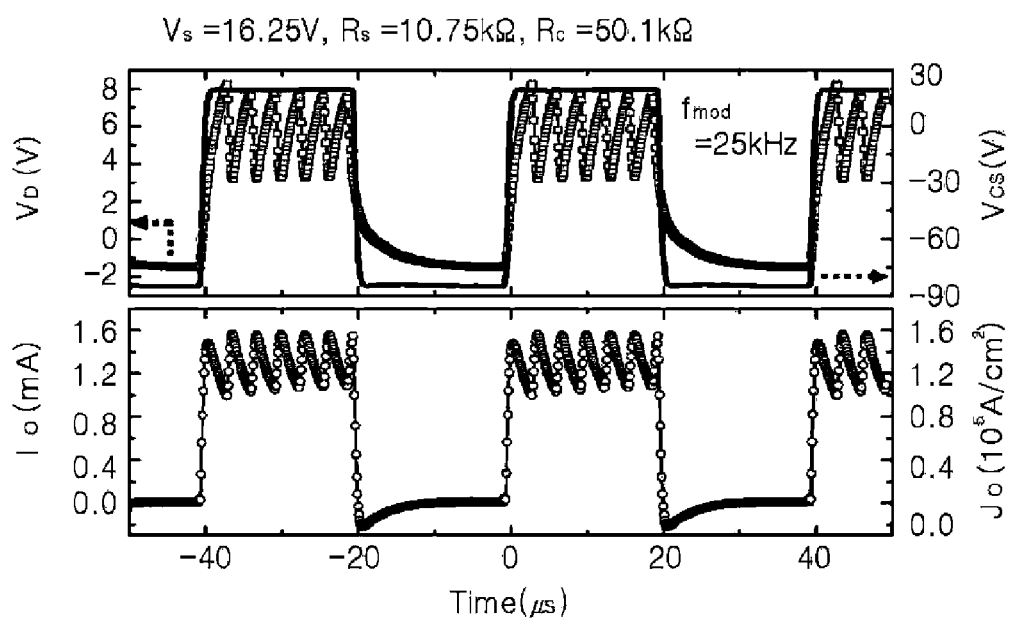
FIG. 7B is a graph illustrating a case when MIT oscillation exists when MIT occurs in the circuit diagram of FIG. 7A.

FIG. 7B is a graph illustrating a case when MIT oscillation exists when MIT occurs in the circuit diagram of FIG. 7A. In FIG. 7B, a voltage $V_S$ applied to the voltage source 600 is 16.25 V, a resistance value of the first external resistor $R_S$ 710 is 10.75 kΩ, and a resistance value of the second external resistor $R_C$ 720 is 50.1 kΩ. Also, a period of the pulse wave is 40 μs.

Referring to FIG. 7B, a voltage having a pulse wave form is applied through the control electrode 400, and accordingly, a discontinuous MIT jump occurs in the MIT device 100. Such a discontinuous MIT jump has an oscillation form in a high voltage section of the pulse wave. The oscillation occurs due to a voltage-current hysteresis curve characteristic of the MIT device 100. In other words, when a abrupt current increases due to the MIT occurrence, a voltage that acts on the MIT device 100 decreases, and thus the MIT is removed, and then, the voltage that acts on the MIT device 100 is increased, which generates the discontinuous MIT jump. These actions are repeated, and thus the oscillation occurs. Since the low voltage section of the pulse wave is below the transition voltage of the MIT device 100, the discontinuous MIT jump does not occur, and thus the oscillation does not occur.

Since the 3-terminal MIT switch of the present invention is a linear device, the MIT oscillation that occurs in the voltage also occurs in a current. A bottom graph of FIG. 7B is a graph that shows the oscillation in the current. It can be seen that the oscillation occurs with a current density $J_o$, of approximately $1 \times 10^5$ A/cm² when an output current from the MIT device 100 is 1 mA.

By applying a suitable voltage and a pulse wave having a suitable period through the control electrode 400, the discontinuous MIT jump in the MIT device 100 can have an oscillation wave pattern. Also, a frequency of the oscillation wave can be adjusted. Accordingly, the 3-terminal MIT switch of the present invention can be used in an apparatus for generating an oscillation wave, and a frequency of the oscillation wave generated by such an apparatus can be easily controlled by a control electrode.

Figure 7C:
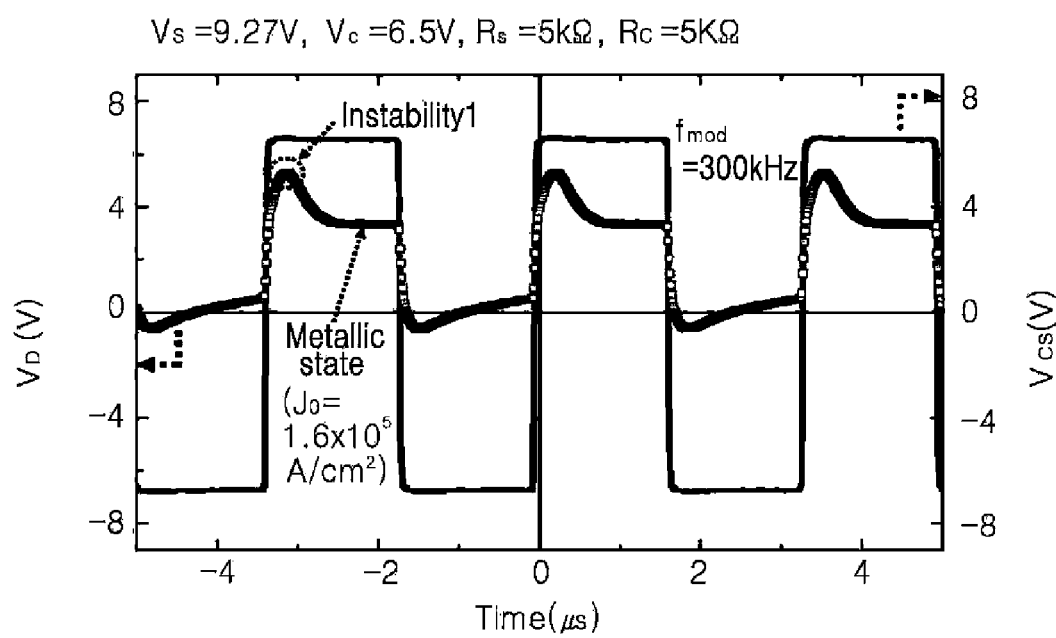
FIG. 7C is a graph illustrating a case when MIT oscillation does not exist when MIT occurs in the circuit diagram of FIG. 7A.

FIG. 7C is a graph illustrating a case when MIT oscillation does not exist when MIT occurs in the circuit diagram of FIG. 7A. A voltage $V_S$ applied to the voltage source 600 is 9.27 V, a resistance value of the first external resistor $R_S$ 710 is 5 kΩ, and a resistance value of the second external resistor $R_C$ 720 is 5 kΩ. Also, a period of the pulse wave is approximately 3.7 μs, and a peak-to-peak voltage of ±6.5 V based on 0 V is applied.

Referring to FIG. 7C, a discontinuous MIT jump occurs in the MIT device 100 through the voltage applied through the control electrode 400, but unlike in FIG. 7B, no oscillation occurs in FIG. 7C. The oscillation does not occur because a period of an applied pulse is too short, and a voltage of the pulse wave changes to the low voltage section before the voltage changes from a voltage that removes the MIT to a voltage that generates MIT. The oscillation may not occur even when the transition voltage of the MIT device 100 is too high, since an interval in a voltage-current hysteresis curve is large. In this case, as the interval increases, the amount of electro-motion increases, and thus heat is generated in the MIT device 100. Accordingly, characteristics of the MIT device 100 change due to heat. For reference, when the MIT device 100 is changed to a metal state due to the occurrence of the discontinuous MIT jump and the voltage that hangs on the MIT device 100 is 3.3 V, the current density of the output current is $1.6 \times 10^5$ A/cm$^2$.

As illustrated in FIGS. 1A through 1D, the 3-terminal MIT switch of the present invention does not need a gate insulation layer, and a discontinuous MIT jump of an MIT device can be easily controlled by applying a transition voltage through a control electrode. Accordingly, the 3-terminal MIT switch can be advantageously used in at least one switching device from among a low voltage, a high voltage, a low current, a high current, a low power, and a high power switching device. Also, by applying a periodical pulse wave through the control electrode, an oscillation wave can be generated, and a frequency of the oscillation wave can also be controlled. Switching of various currents or voltages can be simultaneously controlled by collectively disposing 3-terminal MIT switches in an array or matrix structure and differently configuring transition voltages of MIT devices of each of the 3-terminal MIT switches. Moreover, the 3-terminal MIT switches can be used in an image sensor by disposing the 3-termianl MIT switches in several array or matrix structures.

According to the 3-terminal MIT switch of the present invention, a gate insulation layer is not required unlike the case of a conventional transistor. Also, by adjusting a voltage applied to a control electrode, a discontinuous MIT jump can be easily controlled.

Also, since an MIT device, which is a key component of the 3-terminal MIT switch, can be easily manufactured with low cost, the 3-terminal MIT switch is advantageous in terms of size, manufacture, and costs as compared to a conventional 3-terminal switch.

Moreover, the 3-terminal MIT switch can include an MIT device which has various transition voltages, and accordingly, the 3-terminal MIT switch can be used as a switching device for various powers, such as low power and high power. Also, the 3-terminal MIT switch can be used as a general transistor or a sensor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A 3-terminal metal-insulator transition (MIT) switch, comprising:
    a 2-terminal MIT device which generates a discontinuous MIT in a transition voltage applied thereto, the 2-terminal MIT device including a first terminal and a second terminal, the first terminal being connected to a triple contact point;
    an inlet electrode connected through the triple contact to the first terminal and having an external terminal;
    an outlet electrode connected to the second terminal; and
    a control electrode connected through the triple contact point to the inlet electrode and that includes an external terminal separated from the external terminal of the inlet electrode,
    wherein the 2-terminal MIT device is controlled to generate the MIT according to a voltage or a current applied to the control electrode,
    further wherein the triple contact point is disposed between both of
        the first terminal of the 2-terminal MIT device and the inlet electrode, and
        the first terminal of the 2-terminal MIT device and the control electrode.

2. The 3-terminal MIT switch of claim 1, wherein the 3-terminal MIT switch is formed into a package,
    further wherein the control electrode is connected to the inlet electrode inside the package, and the external terminal of the inlet electrode and the external terminal of the control electrode are separately exposed to the outside of the package.

3. The 3-terminal MIT switch of claim 1, wherein the 3-terminal MIT switch is formed into a package,
    further wherein the control electrode is connected to the inlet electrode outside the package, and the external terminal of the inlet electrode and the external terminal of the control electrode are separated from each other.

4. The 3-terminal MIT switch of claim 1, further comprising:
    a first thin film resistor, wherein the inlet electrode is connected to the first terminal through the first thin film resistor; and
    a second thin film resistor, wherein the control electrode is connected to the first terminal through the second thin film resistor.

5. The 3-terminal MIT switch of claim 1, further comprising a thin film resistor, and
    wherein the inlet electrode is directly connected to the first terminal and not through any resistor, and
    further wherein the control electrode is connected to the inlet electrode through the thin film resistor.

6. A switching system comprising:
    the 3-terminal MIT switch of claim 1; and
    power devices for applying a uniform voltage to the external terminal of the inlet electrode and a voltage or current to the external terminal of the control electrode to control the 2-terminal MIT device to generate the MIT.

7. A switching system comprising:
    the 3-terminal MIT switch of claim 1; and
    a power device for applying a continuous wave voltage in a predetermined frequency to the control electrode to generate the MIT in a predetermined period.

8. A switching system comprising:
    the 3-terminal MIT switch of claim 1; and
    power devices for applying a voltage to the inlet electrode and a voltage to the control electrode, wherein the voltage applied to the inlet electrode is lower than the transition voltage, and
    when a sum of the voltage applied to the control electrode and the voltage applied to the inlet electrode is higher than the transition voltage, the 3-terminal MIT switch is turned on as the MIT is generated in the 2-terminal MIT device, and when the sum is lower than the transition voltage, the 3-terminal MIT switch is turned off as the MIT is not generated in the 2-terminal MIT device.

9. A switching system comprising:
at least one switching device comprising the 3-terminal MIT switch of claim 1, the at least one switching device being selected from among a low voltage switching device, a high voltage switching device, a low current switching device, a high current switching device, a low power switching device, and a high power switching device.

10. A sensor that comprises the 3-terminal MIT switch of claim 1, the sensor detecting physical or chemical factors including a voltage or an electric field, temperature, pressure, and light that can control a concentration of holes of the 2-terminal MIT device.

11. A switching system comprising:
a first power device that applies a voltage or a current to the inlet electrode;
a second power device that applies a voltage or a current to the control electrode; and
the 3-terminal MIT switch of claim 1, further comprising:
a first resistance device; and
a second resistance device,
wherein the first resistance device is connected between the inlet electrode and first power device, and the second resistance device is connected between the control electrode and the second power device.

12. The 3-terminal MIT switch of claim 1, wherein the 3-terminal MIT switch has a multi-layered structure.

13. The 3-terminal MIT switch of claim 1, wherein the control electrode is connected to the first terminal of the 2-terminal MIT device through the triple contact point.

14. A switching system including a 3-terminal MIT switch, the switching system comprising:
a 3-terminal MIT switch, which includes
a 2-terminal MIT device that generates an MIT in a transition voltage, the 2-terminal MIT device including a first terminal and a second terminal, the first terminal being connected to a triple contact point,
an inlet electrode connected through the triple contact point to the first terminal,
a control electrode connected through the triple contact point to the first terminal of the 2-terminal MIT device, and
an outlet electrode connected to the second terminal of the 2-terminal MIT device,
wherein the triple contact point is disposed between both of
the first terminal of the 2-terminal MIT device and the inlet electrode, and
the first terminal of the 2-terminal MIT device and the control electrode;
a first power device connected to the inlet electrode; and
a second power device connected to the control electrode.

15. The switching system of claim 14, wherein
the control electrode is connected to the inlet electrode and an external terminal of the control electrode is separated from an external terminal of the inlet electrode, and
the second power device applies a voltage or a current to the control electrode to control the MIT of the 2-terminal MIT device.

16. The switching system of claim 14, wherein
the 3-terminal MIT switch further includes a first thin film resistor and a second thin film resistor, and
the inlet electrode is connected to the first terminal of the 2-terminal MIT device through the first thin film resistor, and the control electrode is connected to the first terminal of the 2-terminal MIT device through the second thin film resistor.

17. The switching system of claim 14, wherein
the 3-terminal MIT switch further includes a thin film resistor, and
the inlet electrode is directly connected to the first terminal of the 2-terminal MIT device and not through any resistor, and the control electrode is connected to the 2-terminal MIT device by being connected to the inlet electrode through the thin film resistor.

18. The switching system of claim 14, wherein
the first power device is for applying a uniform voltage to an external terminal of the inlet electrode, and
the second power device is for applying a voltage or a variable current to an external terminal of the control electrode to control the MIT of the 2-terminal MIT device.

19. The switching system of claim 14, wherein the second power device is for applying a continuous wave voltage in a predetermined frequency to the control electrode so that the MIT of the MIT device is generated in a predetermined period.

20. The switching system of claim 14, wherein
the first power device is for applying a voltage to the inlet electrode that is lower than the transition voltage,
the second power device is for applying a voltage to the control electrode,
when a sum of the voltage applied to the control electrode and the voltage applied to the inlet electrode is higher than the transition voltage, the 3-terminal MIT switch is turned on as the MIT is generated, and
when the sum is lower than the transition voltage, the 3-terminal MIT switch is turned off as the MIT is not generated in the 2-terminal MIT device.

21. A switching system comprising:
at least one switching system comprising the switching system of claim 14, the at least one switching system being selected from a low voltage switching system, a high voltage switching system, a low current switching system, a high current switching system, a low power switching system, and a high power switching system.

22. A sensor that includes the switching system of claim 14, the sensor for detecting physical or chemical factors including a voltage or an electric field, temperature, pressure, and light that can control concentration of the 2-terminal MIT device.

23. The switching system of claim 14, wherein the switching system includes a plurality of MIT switches, that are the same as the 3-terminal MIT switch, and that are collectively disposed in an array or a matrix structure.

* * * * *